United States Patent [19]

Seki et al.

[11] Patent Number: 4,969,296

[45] Date of Patent: Nov. 13, 1990

[54] APPARATUS OF SURFACE GRINDING OF PLANAR MEMBER

[75] Inventors: Kameharu Seki; Isamu Kubo, both of Miyoshi, Japan

[73] Assignee: Nippon CMK Corp., Japan

[21] Appl. No.: 292,936

[22] Filed: Jan. 3, 1989

[30] Foreign Application Priority Data

Mar. 25, 1988 [JP] Japan .................................. 63-71168

[51] Int. Cl.$^5$ .............................................. B24B 7/00
[52] U.S. Cl. .............................................. 51/57; 51/3; 15/4; 15/5; 15/50.2
[58] Field of Search .................. 51/3, 4, 57, 58, 59 R, 51/61, 330, 334; 15/4, 5, 50 A

[56] References Cited

U.S. PATENT DOCUMENTS

| | | | |
|---|---|---|---|
| 3,019,562 | 2/1962 | Price | 51/3 |
| 3,224,147 | 12/1965 | Ross | 51/281 R |
| 3,277,609 | 10/1966 | Imitaro et al. | 51/78 |
| 3,406,417 | 10/1966 | Niles et al. | 15/4 |
| 3,859,683 | 1/1975 | Coult | 15/4 |
| 3,860,991 | 1/1975 | Heidt | 15/4 |
| 4,016,617 | 4/1977 | Cardus | 15/4 |
| 4,513,543 | 4/1985 | Lawrenson et al. | |
| 4,536,909 | 8/1985 | Burger et al. | 15/4 |
| 4,573,289 | 3/1986 | Wieck | 51/57 |
| 4,733,500 | 3/1988 | David | 51/138 |

FOREIGN PATENT DOCUMENTS 56-55346 10/1982 Japan ........................................ 51/50

Primary Examiner—Frederick R. Schmidt
Assistant Examiner—M. Rachuba
Attorney, Agent, or Firm—Bruce L. Adams; Van C. Wilks

[57] ABSTRACT

An apparatus for surface grinding a planar surface of an article comprises a two-stage grinding head having an upstream-stage grinding brush and a downstream-stage grinding stone. The article is advanced past the grinding head while the grinding head is eccentrically driven so that the grinding brush coarsely grinds the planar surface and forms therein spiral brush traces and the grinding stone finely grinds the coarsely ground planar surface to smoothen the brush traces.

14 Claims, 3 Drawing Sheets

APPARATUS OF SURFACE GRINDING OF PLANAR MEMBER

BACKGROUND OF THE INVENTION

The present invention relates generally to an apparatus of surface grinding planar members, and more particularly, to an apparatus for surface grinding printed wiring boards for surface treatment thereof during their manufacture.

Conventionally, surface grinding of planar members is performed by a rotary brush or rotary stone. However, as the kinetic energy changes center portion to the peripheral portion of such a rotary brush, the ground surface can not be made uniform when the plane surface of such a tool contacts the planar member, and also, as the contact surface of the tool is too small when the peripheral surface thereof contacts the planar member, the ground surface also is not uniform.

To solve the above mentioned disadvantages, our Japanese Patent Application No. 62-283368, filed Nov. 10, 1987 and entitled "Method of Surface Grinding of Planar Member" discloses a method of surface grinding a planar member by a grinding tool which moves eccentrically on a plane.

All portions of the eccentrically moving planar tool, e.g. a brush, have the same kinetic energy, in contrast to a rotary brush, so that the same grinding effect is applied to the surface to be ground and a uniform ground surface can be obtained, and such results in uniform wear of the brush.

All grinding devices of the prior art perform only one function which is regarded as natural from the point of view of construction and purpose. However, when the quantity to be ground is very small, it is desirable to combine two grinding functions in one tool to perform continuously two functions by one process.

SUMMARY OF THE INVENTION

The object of the present invention is to solve the above mentioned drawbacks, and to provide an improved grinding apparatus to perform two grinding functions continuously by one device which may have a brush and a grinding stone.

According to the apparatus, the grinding member has substantially rectangular plane grinding surface which consists of a first and a second grinding means which are different from each other and are driven simultaneously by one eccentric shaft.

Preferably, the first grinding member is a grinding brush, and the second grinding member is a grinding stone disposed on the downstream-side of the grinding brush.

Preferably, the urging forces to the first and second grinding members are regulatable independently.

The grinding device having two different grinding means and driven by one eccentric shaft, according to the present invention, performs two grinding processes on one work table so that surface finishing process of the planar member is simplified.

DETAILED DESCRIPTION OF THE INVENTION

Figure 1:
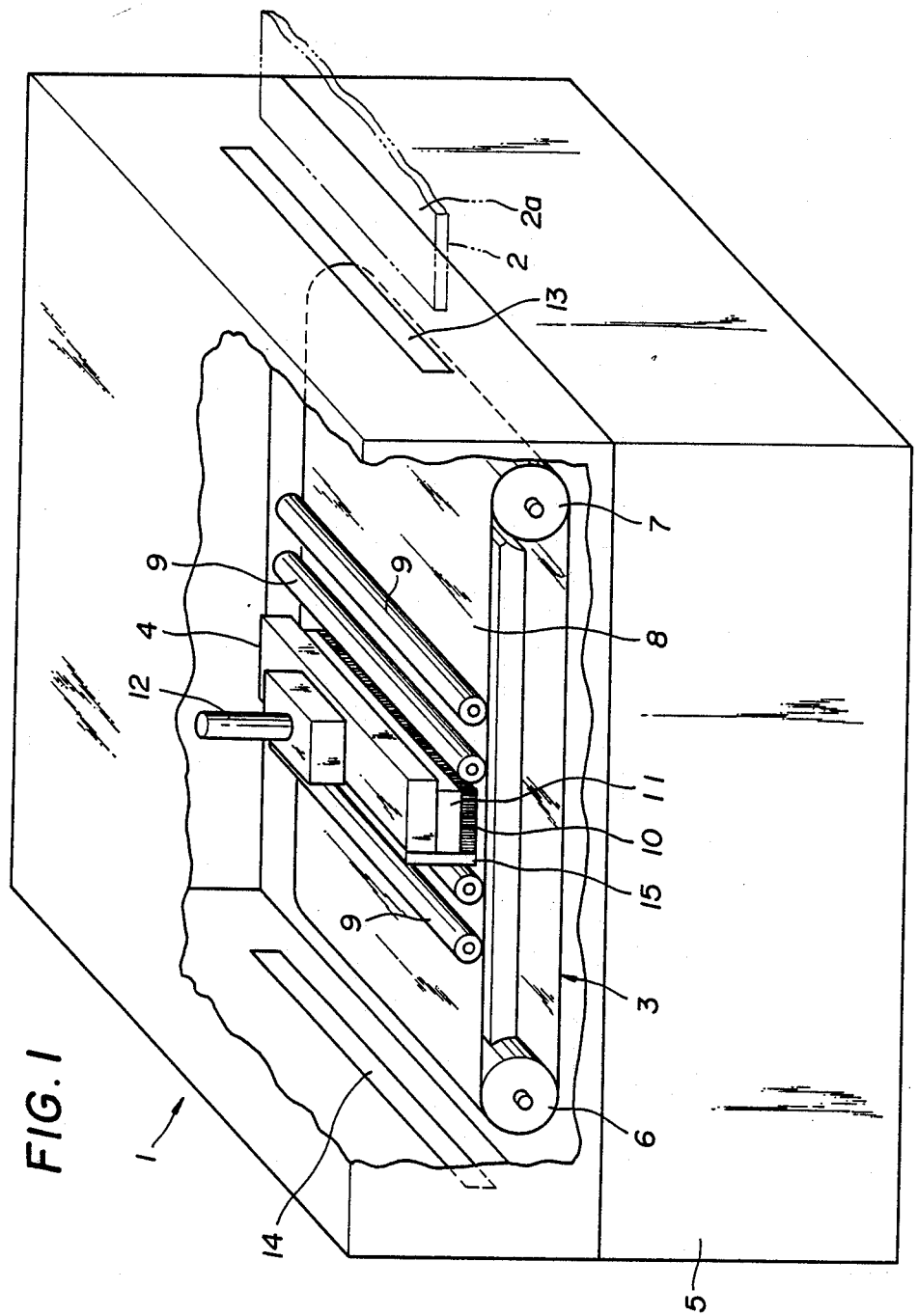
FIG. 1 is a perspective view of a surface grinding apparatus for performing the method of surface grinding printed wiring boards, according to one embodiment of the present invention.
Figure 2:
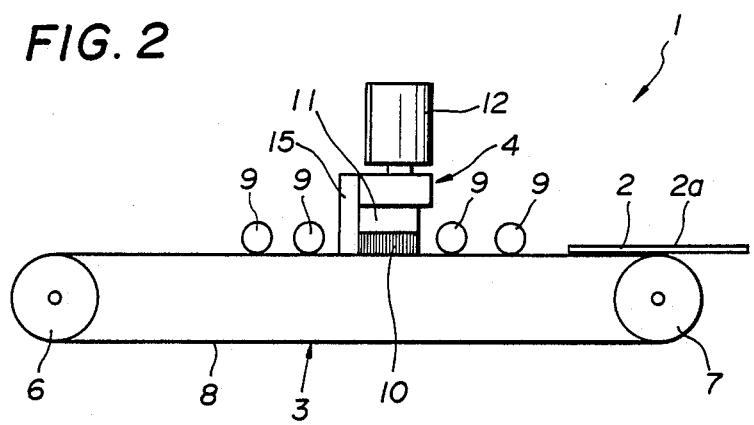
FIG. 2 is a schematic front view of a portion of FIG. 1.
Figure 3:
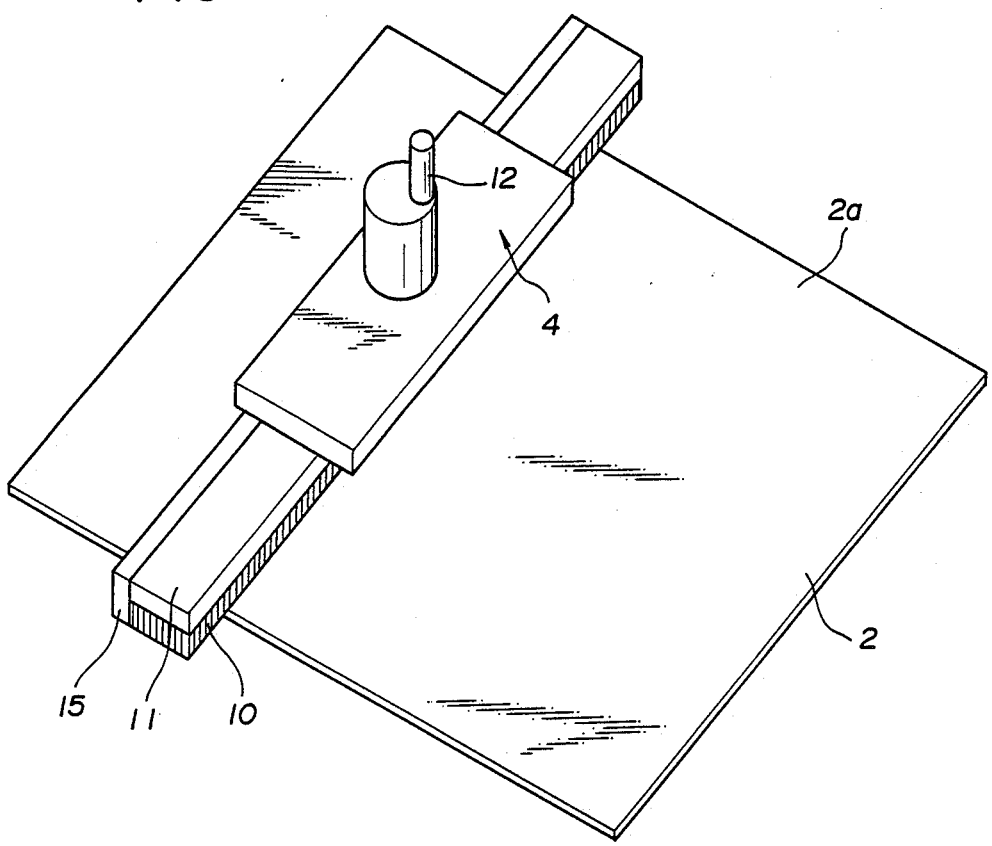
FIG. 3 is a perspective view of a portion of FIG. 1 showing the surface grinding of a printed wiring board.

Referring to FIG. 1, a surface grinding apparatus 1 includes a conveyor device 3 to convey printed wiring boards 2 shown in FIG. 2, a grinding head or device 4 to grind a surface 2a of a printed wiring board 2 which is conveyed by the conveyor device 3, and a housing body 5 receiving the conveyor device 3 and the grinding device 4.

The conveyor device 3 includes two rotatably supported conveyor rolls 6 and 7, and an endless belt 8 around the rolls 6 and 7. Guide rolls 9 guide the printed wiring boards 2 on the belt 8. An eccentric shaft 12 drives a brush support 11 with a brush body 10 eccentrically on one plane so that all portions of the brush body 10 receive the same kinetic energy.

According to the present invention, the grinding head or device 4 includes the brush body 10, the brush support 11, a grinding stone 15 which is downstream from and parallel with the brush body 10, and the eccentric shaft 12 secured to the brush support 11. The brush body 10 is attached under the relatively long and rectangular planar brush support 11. The brush support 11 and the grinding stone 15 are driven in unison eccentrically through the eccentric shaft 12. The brush support 11 and the grinding stone 15 are supported such that the urging forces to grind the surface 2a of the printed wiring board 2 can be regulated. However, the brush support 11 and the grind stone 15 may be secured with each other as desired when only the urging force of the grinding stone 15 is to be regulated.

As the brush support 11 and the grinding stone 15 are driven by the eccentric shaft 12 on one plane, the upstream-side brush body 10 forms grinding traces on the surface of the printed wiring board 2 uniformly and the downstream-side grinding stone 15 forms a smooth ground surface by smoothing out the ground traces of the brush 10. Thus in accordance with the invention, a two-stage grinding head 4 is used to effect coarse grinding by means of the upstream grinding brush 10 and fine grinding by means of the downstream grinding stone 15.

On both sides of the housing body 5, inlet and outlet openings 13 and 14 are formed to supply and discharge the printed wiring boards 2.

The manner of grinding the surface 2a of the printed wiring board 2 by the surface grinding apparatus 1 will now be described.

At first, printed wiring boards 2 to be surface finished are supplied in succession through the opening 13. The supplied printed wiring boards 2 are fed sequentially through the conveyor device 3 to the grinding device 4.

The brush body 10 and the grinding stone 15 are driven eccentrically on a plane through the eccentric shaft 12 to grind the surface 2a of the printed wiring board 2. The eccentric motion of the brush body 10 and the grinding stone 15 forms generally spiral brush traces on the surface 2a (coarse grinding) by the upstream side brush 10, and then the brush traces are around off by the downstream grinding stone 15 (fine grinding).

Then, the surface finished printed wiring board 2 is conveyed by the conveyor belt 8 to the discharge outlet 14.

Figure 4:
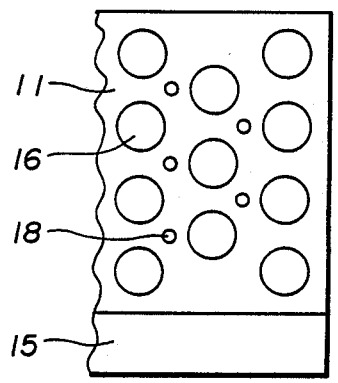
FIG. 4 is a plan view of a brush and a grinding stone, according to another embodiment of the present invention.
Figure 5:
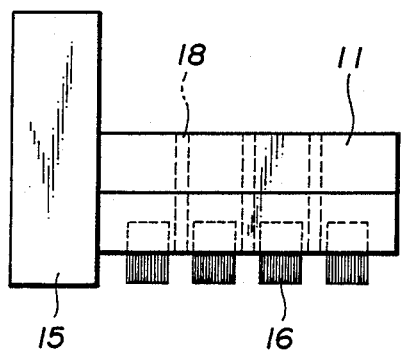
FIG. 5 is an end view of FIG. 4.

FIGS. 4 and 5 show another embodiment which is preferably used to surface grind relatively soft material, e.g. copper clad on the printed wiring board 2. The same reference numerals shows the same or similar parts or portions as in the first embodiment.

The brush 10 includes many brush bundles 16 and the fibers forming the bundles 16 contain grinding material. The brush body 11 has many water feed openings 18 to inject a liquid coolant such as water from a water supply (not shown). The grinding stone 15, which is parallel with the brush body 11, is a rubber grinding stone in this embodiment. The arrangement can be used to perform two different grinding functions without requiring a precise relative position regulating device to obtain the required surface finish.

As described in detail, according to the present invention, the planar brush body 10 and the grinding stone 15 are simultaneously eccentrically driven by one eccentric shaft 12 on one plane so that uniform brush traces are formed on the printed wiring board by the upstream-side (coarse grinding) brush 10 and the brush traces are smoothed out by the downstream side grinding stone 15 (fine grinding). Thus, the surface 2a of the printed wiring board 2 can be surface finished by one process, and the finished surface is sufficient to perform later processes of good laminate adhering, good printing ink border and good fine pattern forming.

Further, as the brush is planar, in contrast to conventional circular brush, the brush can be manufactured easily to reduce manufacturing cost. Also, as the apparatus is essentially an apparatus to perform one grinding function so that simple and inexpensive construction and short working line can be realized.

Also, in the embodiment shown in FIG. 1, the grinding brush device 4 may include water injection means (not shown) to inject high pressure water into the brush body 10 to wash out copper powder and debris from the surface 2a of the printed wiring board to obtain a clean finish.

As described fully, according to the present invention, two different kinds of plane finishing processes can be performed by only one work shaft simply and accurately. Thus, an apparatus of simple construction, easy working, low cost, and accurate finishing can be realized.

We claim:

1. An apparatus for surface grinding a member having a generally planar surface, comprising: a two-stage grinding head having upstream grinding means for coarsely grinding a generally planar surface of a member and downstream grinding means for finely grinding the coarsely ground planar surface; and means for moving the first and second grinding means in eccentric motions relative to the planar surface.

2. An apparatus according to claim 1; wherein the means for moving the first and second grinding means includes means for moving the first and second grinding means in unison.

3. An apparatus according to claim 1; wherein the means for moving the first and second grinding means comprises means for eccentrically driving the grinding head to impart eccentric motions to the first and second grinding means.

4. An apparatus according to claim 1; including means for injecting a liquid coolant through the grinding head onto the planar surface during the grinding.

5. An apparatus according to claim 1; wherein the upstream grinding means comprises a grinding brush and the downstream grinding means comprises a grinding stone.

6. An apparatus according to claim 5; wherein the means for moving comprises means for moving the grinding brush and grinding stone in unison in eccentric motions relative to the planar surface to cause the grinding brush to form generally spiral brush traces on the planar surface and to cause the grinding stone to smoothen the brush traces.

7. An apparatus according to claim 6; wherein the means for moving comprises support means supporting thereon both the grinding brush and grinding stone, and means for eccentrically driving the support means to impart eccentric motions to the grinding brush and grinding stone.

8. An apparatus according to claim 6; including means for injecting a liquid coolant through the support means onto the planar surface during the grinding.

9. An apparatus according to claim 8; wherein the means for injecting includes a plurality of openings extending through the support means for flowing the liquid coolant therethrough.

10. An apparatus according to claim 5; wherein the grinding brush comprises a plurality of spaced-apart brush bundles.

11. An apparatus according to claim 5; wherein the grinding brush and the grinding stone have respective grinding faces which lie in a common plane.

12. An apparatus according to claim 5; including means for independently regulating the grinding force of the grinding brush and the grinding stone.

13. An apparatus according to claim 5; including means for advancing the member past the grinding head to enable the planar surface thereof to be coarsely and finely ground during one advancement past the grinding head.

14. An apparatus according to claim 1; including means for advancing the member past the grinding head to enable the planar surface thereof to be coarsely and finely ground during one advancement past the grinding head.

* * * * *